(12) United States Patent
Li (10) Patent No.: US 11,791,825 B2
(45) Date of Patent: Oct. 17, 2023

(54) COUNTING CIRCUIT AND CHIP

(71) Applicant: SHANGHAI XINLONG SEMICONDUCTOR TECHNOLOGY CO., LTD., Shanghai (CN)

(72) Inventor: Ruiping Li, Shanghai (CN)

(73) Assignee: SHANGHAI XINLONG SEMICONDUCTOR TECHNOLOGY CO., LTD., Shanghai (CN)

( * ) Notice: Subject to any disclaimer, the term of this patent is extended or adjusted under 35 U.S.C. 154(b) by 180 days.

(21) Appl. No.: 17/609,469

(22) PCT Filed: May 20, 2021

(86) PCT No.: PCT/CN2021/094862
§ 371 (c)(1),
(2) Date: Nov. 8, 2021

(87) PCT Pub. No.: WO2021/213539
PCT Pub. Date: Oct. 28, 2021

(65) Prior Publication Data
US 2022/0224340 A1  Jul. 14, 2022

(30) Foreign Application Priority Data

Oct. 12, 2020 (CN) .......................... 202011081721.1

(51) Int. Cl.
*H03K 21/00* (2006.01)
*H03K 21/08* (2006.01)
*H03K 17/687* (2006.01)

(52) U.S. Cl.
CPC ........... *H03K 21/08* (2013.01); *H03K 17/687* (2013.01)

(58) Field of Classification Search
CPC ...... H03K 21/00; H03K 21/02; H03K 21/023; H03K 21/08; H03K 21/38; H03K 23/002; H03K 23/004; H03K 25/02; H03K 17/687
See application file for complete search history.

(56) References Cited

U.S. PATENT DOCUMENTS

| 3,989,956 | A | 11/1976 | Walden |
| 6,969,979 | B2 * | 11/2005 | Kohout ................. H02M 3/158 323/282 |

(Continued)

FOREIGN PATENT DOCUMENTS

| CN | 106092339 A | 11/2016 |
| CN | 106656166 A | 5/2017 |

(Continued)

OTHER PUBLICATIONS

International Search Report, China National Intellectual Property Administration, dated Aug. 18, 2021, 4 pages.

*Primary Examiner* — Long Nguyen
(74) *Attorney, Agent, or Firm* — ZIEGLER IP LAW GROUP LLC (57) ABSTRACT

A counting circuit and a chip are disclosed. The counting circuit includes a charge counter module including a pulse processing module and a first capacitor. The pulse processing module is configured to covert a received pulse signal into a counting current and to transfer the converted counting current to the first capacitor. The first capacitor is configured to receive the counting current and store charge carried in the counting current. The counting circuit takes a voltage of the first capacitor as a basis for counting. The input voltage pulse signal is converted into a current signal in the form of micro pulses for charging the non-variable capacitor, and a counting result is obtained by detecting the voltage of the first capacitor, achieving the following advan- (Continued)

tages: no need to take care of whether the input pulse signal is continuous or discrete; high resistance to interference; adaptiveness to various input pulse signals of different waveforms and/or with different frequencies; and the ability to solve the problem with the conventional counting circuits that they may not be able to cope with irregular pulse signals and may even not be able to operate normally when such an irregular pulse signal is input.

8 Claims, 3 Drawing Sheets

(56) References Cited

U.S. PATENT DOCUMENTS 10,594,305 B2 * 3/2020 Fukushima .......... H03K 3/0231
2017/0295333 A1 10/2017 Boemler

FOREIGN PATENT DOCUMENTS

| CN | 108886594 A | 11/2018 |
| CN | 111245383 A | 6/2020 |
| CN | 111934672 A | 11/2020 |

* cited by examiner

COUNTING CIRCUIT AND CHIP

TECHNICAL FIELD

The present invention relates to the field of power chips and, in particular, to a counting circuit and a chip.

BACKGROUND

Most conventional counting circuits in power chips are fabricated using a metal-oxide-semiconductor (MOS) field effect transistor (FET) digital integrated circuit (IC) process, and in order to achieve desired counting accuracy, pulse signals suitable to be input to such circuits are limited to, for example, digital pulse signals, signals at specified frequencies or with specified duty cycles, or continuous clock signals. Counting a random, discontinuous, linear or analog pulse signal using a conventional counting circuit requires pretreatment of the signal by filtering, processing and computation or the addition of a micro processing unit with determining, analyzing and processing capabilities. Otherwise, the counting circuit may not be able to operate normally. This increases the circuit's complexity and cost to a certain extent.

All in all, the conventional counting circuits are associated with the problem that they may not be able to cope with irregular (e.g., random, discontinuous, linear or analog) pulse signals and may even not be able to operate normally when such a signal is input.

SUMMARY OF THE INVENTION

It is an objective of the present invention to solve the problem associated with the conventional counting circuits that they may not be able to cope with irregular pulse signals and may even not be able to operate normally when such a signal is input by presenting a novel counting circuit and a chip.

To this end, the provided counting circuit includes a charge counter module including a pulse processing module, a first capacitor, a voltage comparison module and a signal processing module.

The pulse processing module includes a first circuit, a second circuit and a current mirror. The first circuit includes a first transistor and a resistor. The second circuit includes a second transistor. The first circuit is connected to the second circuit via the current mirror, and the first transistor is configured to convert a received pulse signal into a first current. The current mirror is configured to mirror the first current to a second current, and the second transistor is configured to convert the second current into a counting current and transfer it to the first capacitor. A ratio of an effective value of the second current to an effective value of the counting current is equal to 100 or greater.

The first capacitor is configured to receive the counting current and store charge carried by the counting current.

A voltage of the first capacitor is taken by the counting circuit as a basis for counting.

The voltage comparison module includes a first input terminal and a second input terminal. The first input terminal is configured to receive the voltage of the first capacitor, and the second input terminal is configured to receive a preset reference voltage. The voltage comparison module is configured to output a trigger signal in the event of the voltage of the first capacitor rising beyond the reference voltage.

The signal processing module is configured to convert the trigger signal into a stop signal, marking the end of a counting cycle.

Optionally, the first transistor may be an NPN transistor and have a base for receiving the pulse signal, a collector connected to an input terminal of the current mirror, and an emitter connected to one end of the resistor. The other end of the resistor may be grounded.

The second transistor may be a PNP transistor and have an emitter connected to an output terminal of the current mirror, a collector that is grounded, and a base for outputting the counting current.

Optionally, the first input terminal may include a p-channel junction field effect transistor (JFET) having a gate connected to the first capacitor.

Optionally, the second input terminal may include a p-channel JFET having a gate connected to an adjustable constant voltage supply.

Optionally, the signal processing module may include a second capacitor and a stop signal output terminal. The second capacitor may have a first terminal connected to the voltage comparison module, and the second capacitor may have a second terminal connected to the stop signal output terminal. In the event of the trigger signal being at a high level, the second capacitor may be configured to be charged or held, with the first terminal being positive, resulting in a low level being output from the signal processing module. In the event of the trigger signal being at a low level, the second capacitor may be configured to charged, with the second terminal being positive, resulting in a high level being output from the signal processing module during the charging process.

Optionally, the counting circuit may further include a discharge module connected to the first capacitor. The discharge module may have a trigger terminal connected to the stop signal output terminal of the signal processing module, and the discharge module may be configured to discharge the first capacitor in response to the stop signal being output from the signal processing module.

Optionally, the counting circuit may further include a reset module connected to the first capacitor. The reset module may have a reset trigger terminal, and the reset module may be configured to discharge the first capacitor in response to a reset signal being received at the reset trigger terminal.

The above object is also attained by a chip provided in the present invention, which includes the counting circuit as defined above. The chip is fabricated using a transistor IC fabrication process or a metal-oxide-semiconductor field effect transistor (MOSFET) IC fabrication process.

Compared with the prior art, in the counting circuit and chip provided in the present invention, the charge counter module includes the pulse processing module and the first capacitor. The pulse processing module is configured to covert a received pulse signal into a counting current and to transfer the converted counting current to the first capacitor, and the first capacitor is configured to receive the counting current and store charge carried in the counting current. The counting circuit takes the voltage of the first capacitor as a basis for counting. With this arrangement, the input voltage pulse signal is converted to a current signal in the form of micro pulses for charging the first capacitor, and a counting result is obtained by detecting the voltage of the first capacitor, achieving the following advantages: no need to take care of whether the input pulse signal is continuous or discrete; high resistance to interference; adaptiveness to various input pulse signals of different waveforms and/or with different frequencies; and the ability to solve the problem with the conventional counting circuits that they may not be able to cope with irregular pulse signals and may even not be able to operate normally when such an irregular pulse signal is input.

BRIEF DESCRIPTION OF THE DRAWINGS

Those of ordinary skill in the art would appreciate that the following drawings are presented merely to enable a better understanding of the present invention rather than limit the scope thereof in any sense. In the drawings.

In these figures,

100—charge counter module; 200—voltage comparison module; 300—signal processing module; 400—discharge module; 500—reset module;
110—pulse processing module; 111—first transistor; 112—current mirror; 113—second transistor; 114—resistor; 120—first capacitor; 210—first input terminal; 220—second input terminal; 230—constant voltage supply; 310—second capacitor; 320—stop signal output terminal; 410—trigger terminal; 510—reset trigger terminal.

DETAILED DESCRIPTION

Objectives, advantages and features of the present invention will become more apparent from the following detailed description of specific embodiments thereof, which is to be read in connection with the accompanying drawings. Note that the figures are provided in a very simplified form not necessarily drawn to exact scale for the only purpose of helping to explain the disclosed embodiments in a more convenient and clearer way. In addition, structures shown in the figures are usually part of actual structures. In particular, as the figures tend to have distinct emphases, they are often drawn to different scales.

As used herein, the singular forms "a", "an" and "the" include plural referents unless the context clearly dictates otherwise. The term "or" is employed in the sense including "and/or" unless the context clearly dictates otherwise. The term "several" is used in the sense of "at least one", and the phrase "at least two" is used in the sense of "two or more". Moreover, the use of the terms "first", "second" and "third" herein is intended for illustration only and is not to be construed as denoting or implying relative importance or as implicitly indicating the numerical number of the referenced item. Accordingly, defining an item with "first", "second" or "third" is an explicit or implicit indication of the presence of one or at least two of the item. The terms "one end" and "the other end", or "proximal end" and "distal end", are generally used to refer to opposing end portions including the opposing endpoints, rather than only to the endpoints. Further, the terms "installation", "connection" and "coupling" should be interpreted in a broad sense. For example, a connection may be a permanent, detachable or integral connection, or a mechanical or connection, or a direct or indirect connection with one or more intervening elements, or an internal communication or interaction between two components, unless the context clearly dictates otherwise. Those of ordinary skill in the art can understand the specific meanings of the above-mentioned terms herein according to the specific circumstances.

The core concept of the present invention is to solve the problem associated with the conventional counting circuits that they may not be able to cope with irregular pulse signals and may even not be able to operate normally when such a signal is input by presenting a novel counting circuit and a chip.

In the following description, reference is made to the accompanying drawings.

EMBODIMENTS

Figure 1:
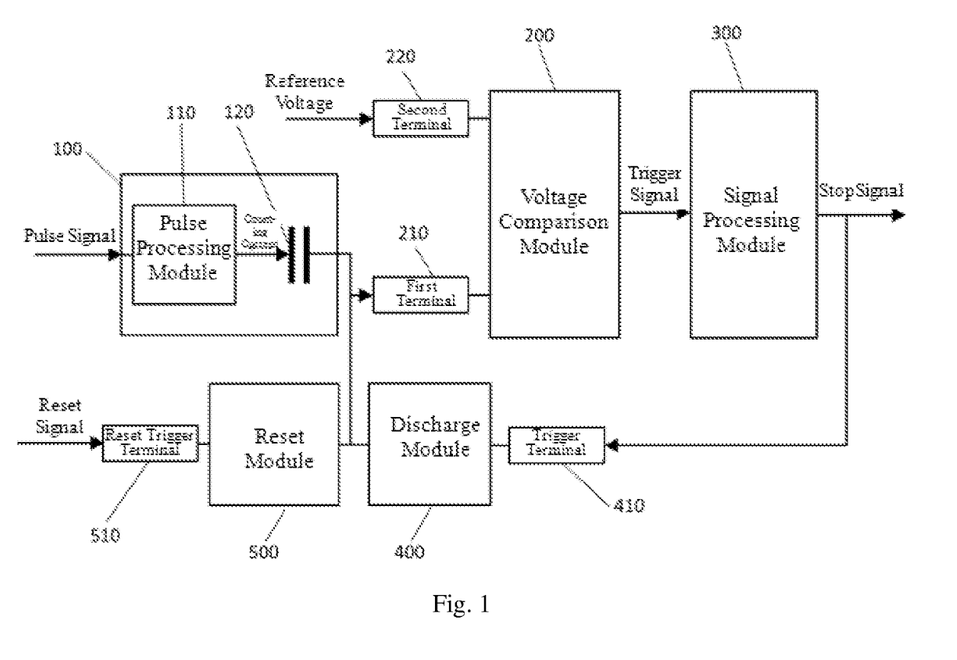
FIG. 1 is a schematic diagram illustrating the structure of a counting circuit according to an embodiment of the present invention.
Figure 2:
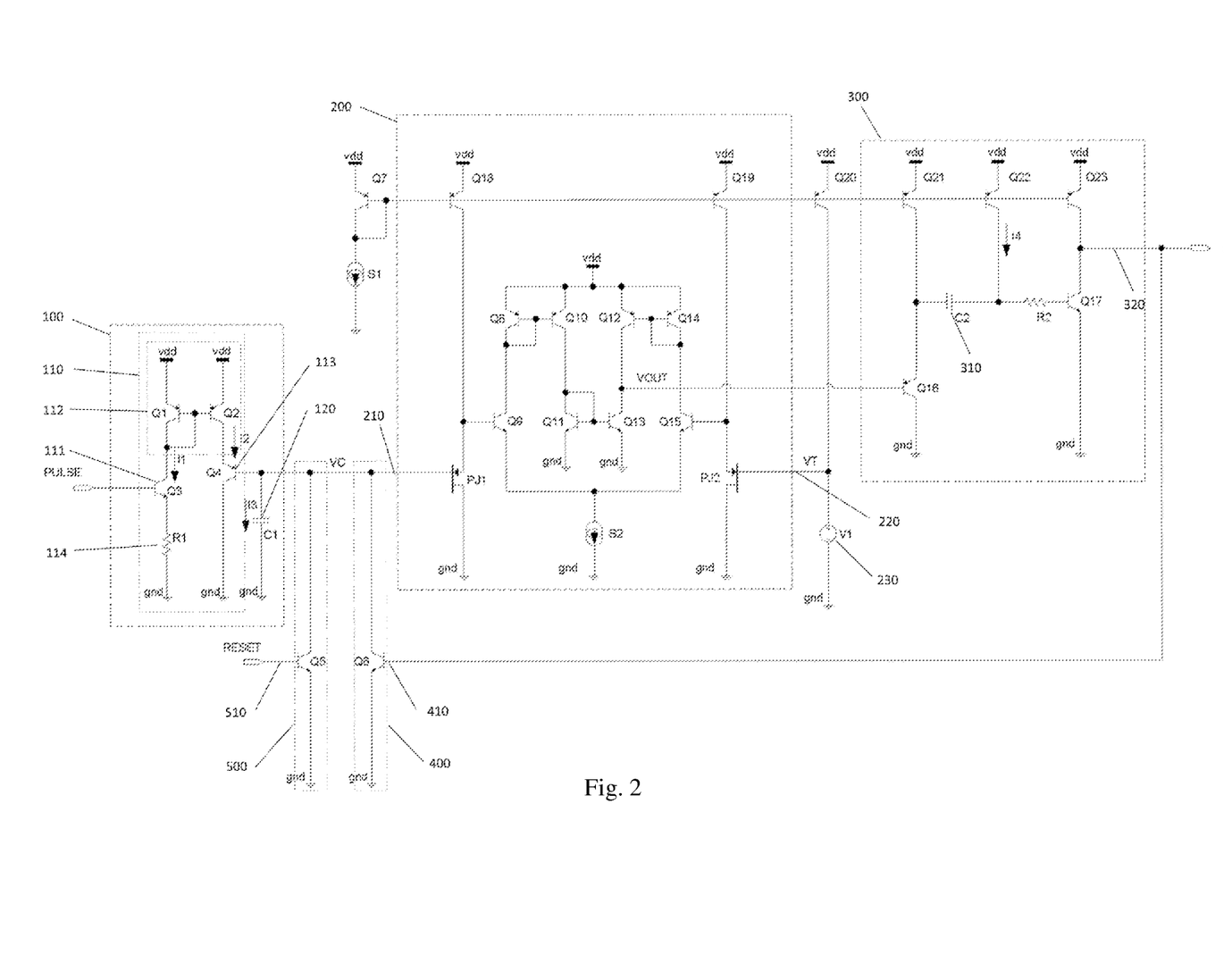
FIG. 2 is a schematic circuit diagram of the counting circuit according to an embodiment of the present invention.
Figure 3:
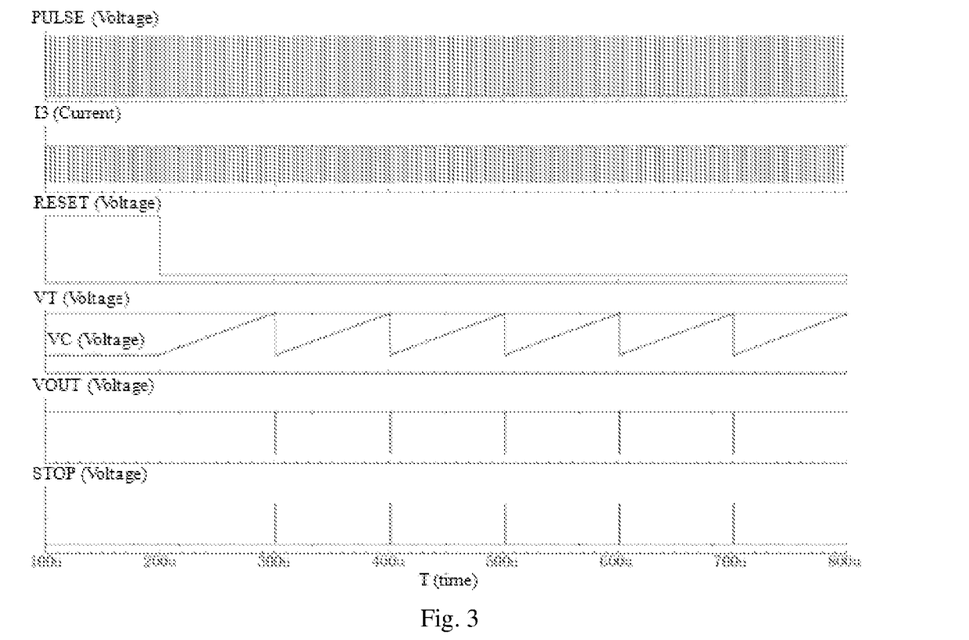
FIG. 3 is a schematic waveform diagram of the counting circuit for a continuous pulse signal according to an embodiment of the present invention.
Figure 4:
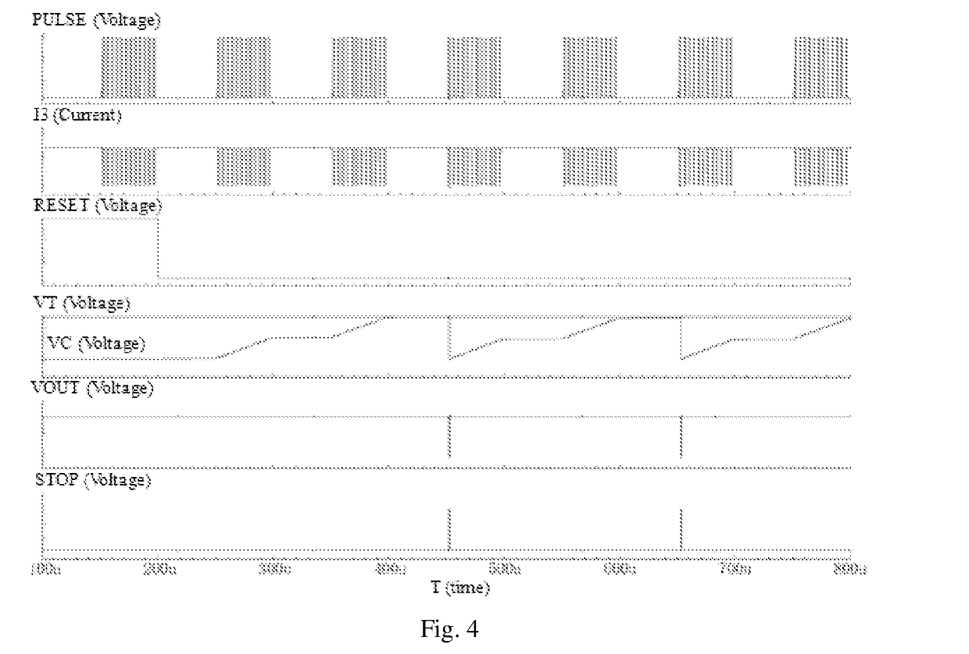
FIG. 4 is a schematic waveform diagram of the counting circuit for a series of discrete pulse signals according to an embodiment of the present invention.

Reference is now made to FIGS. 1 to 4. FIG. 1 is a schematic diagram illustrating the structure of a counting circuit according to an embodiment of the present invention. FIG. 2 is a schematic circuit diagram of the counting circuit according to an embodiment of the present invention. FIG. 3 is a schematic waveform diagram of the counting circuit for a continuous pulse signal according to an embodiment of the present invention. FIG. 4 is a schematic waveform diagram of the counting circuit for a series of discrete pulse signals according to an embodiment of the present invention.

As shown in FIG. 1, the counting circuit of the present invention includes a charge counter module 100. The charge counter module 100 includes a pulse processing module 110 and a first capacitor 120.

The pulse processing module 110 is configured to convert a received pulse signal into a counting current I3 and transfer it to the first capacitor 120.

The first capacitor 120 is configured to receive the counting current I3 and store the charge carried by the counting current I3.

The counting circuit takes a voltage VC of the first capacitor 120 as a basis for counting.

Conventional counters typically require input signals to be digital pulse signals or clock signals, which are continuous, at specified frequencies and with specified duty cycles and voltage amplitudes, and typically count the signals by timekeeping or multi-step frequency division. Therefore, they present limitations and restrictions to input pulse signals.

The counting circuit according to the embodiment counts an input voltage pulse signal by converting it into a current signal in the form of micro pulses, charging the first capacitor 120 with the micro pulses, and detecting the voltage of the first capacitor 120. It has the following advantages:

1. Counting by storage of charge is independent of the time domain, making it irrelevant whether the input pulse signal is continuous or not.

2. It relies on the accumulation of charge and is highly resistant to interference. The counting performance will not be affected if small voltage spikes or other interfering signals (absence of energy or presence of extremely weak energy).

3. As the counting circuit according to the embodiment operates only in a linear analog region and relies on storage of charge for counting, the input pulse signal is allowed to be either analog or digital. Therefore it is adaptive and applicable to multiple types of input pulse signal.

Referring to FIG. 2, in one embodiment, the pulse processing module 110 includes a first transistor 111, a current mirror 112 and a second transistor 113.

The first transistor 111 is configured to convert the pulse signal into a first current I1.

The current mirror 112 is configured to mirror the first current I1 to a second current I2 and stabilize the current.

The second transistor 113 is configured to convert the second current I2 into the counting current I3. A ratio of an effective value of the second current to an effective value of the counting current is equal to 100 or greater.

With this arrangement, the input voltage pulse signal can be effectively converted to the current signal in the form of micro pulses. During fabrication of chip, due to limitations in terms of area and cost, it is challenging to integrate a high-capacitance capacitor in the chip. Built-in capacitors typically have a capacitance of tens of pF. For this reason, it is sensible to assume that the first capacitor 120 has a capacitance of pF order. In order to achieve an extended charge period and more pulse cycles available for counting, it is necessary to limit the effective value of the counting current I3 through providing it as micro pulses. Through repeated experiments, the inventors have found that the ratio of the effective value of the second current to that of the counting current that is equal to 100 or greater allows good use to be made of the capacitance of the first capacitor 120, resulting in an expanded counting range.

The pulse processing module 110 further includes a first circuit (i.e., the circuit in which I1 flows, as shown in FIG. 2), a second circuit (i.e., the circuit in which I2 flows, as shown in FIG. 2) and a resistor 114. The first transistor 111 may be an NPN transistor, while the second transistor 113 may be a PNP transistor.

The first transistor 111 has a base for receiving the pulse signal, as well as a collector and an emitter, which are both connected, together with the resistor 114 and an input terminal of the current mirror 112, in the first circuit.

An output part of the current mirror 112 is connected in the second circuit, together with an emitter and a collector of the second transistor 113.

The first circuit is connected to the second circuit via the current mirror 112.

The second transistor 113 is configured to output from a base thereof the counting current I3.

With this arrangement, if the pulse signal received at the base of the first transistor 111 is at a high level, the first circuit is conducted to produce the first current I1, achieving the aforementioned conversion. Specifically, an instantaneous value of the first current I1 is equal to (Vpulse−Ube)/R1, where Vpulse is an instantaneous amplitude of the pulse signal, Ube is a base-to-emitter voltage drop of the first transistor 111, and R1 is the resistance of the resistor 114. The first current I1 is then mirrored by the current mirror 112 to the second current I2, the second current I2 has the same instantaneous value as the first current I1. In this way, stabilization of the second current I2 is achieved. Finally, taking advantage of the characteristic of a transistor that an emitter current thereof is approximately equal to its base current times the transistor's DC amplification coefficient Beta, the second transistor 113 provides the counting current I3, the counting current I3 has an instantaneous value equal to (Vpulse−Ube)/R1/Beta, where Beta denotes the amplification coefficient of the second transistor 113. As apparent from the expression, the instantaneous value of I3 is relatively low, demonstrating the effectiveness of this design. In an exemplary embodiment, Beta is equal to 100.

It is to be understood that the foregoing embodiment presents merely one example circuit implementation that can produce the micro-pulse current. Indeed, there are many other alternative implementations capable of performing the same function. 1) In some of such implementations, a different wiring design is employed. For example, differing from the design shown in FIG. 2 in which a common node for the current mirror 112 is a positive terminal of a power supply, the ground may be instead designed as the common node for the current mirror 112. In this case, in the first circuit, the positive terminal of the power supply is connected to the collector of the first transistor 111, and the emitter of the first transistor 111 is connected to one end of the resistor 114. The other end of the resistor 114 is connected to a collector of a transistor at the input terminal of the current mirror 112, and an emitter of this transistor at the input terminal of the current mirror 112 is grounded. In the second circuit, the positive terminal of the power supply is connected to the emitter of the second transistor 113, and the collector of the second transistor 113 is connected to a collector of a transistor at the output terminal of the current mirror 112. An emitter of the transistor at the output terminal of the current mirror 112 is grounded. 2) Some other implementations replace one or more of the above components with more sophisticated but functionally equivalent circuits. For example, the second transistor 113 may be replaced with a current amplification circuit. 3) In still some other implementations, some part, e.g., the current mirror 112 may be omitted, and a circuit that can counteract the adverse effects arising from the omission of the current mirror 112 with the current stabilization capabilities may be added downstream. All in all, the pulse processing module 110 functions to properly convert the received pulse signal into the counting current I3, and any particular circuit implementation based on this idea is considered to be within the scope as defined in the appended claims.

Referring to FIG. 1 or 2, in a particular embodiment, the counting circuit further includes a voltage comparison module 200, the voltage comparison module 200 has a first input terminal 210 and a second input terminal 220.

The first input terminal 210 is configured to receive the voltage of the first capacitor 120.

The second input terminal 220 is configured to receive a preset reference voltage VT.

When the voltage VC of the first capacitor 120 rises beyond the reference voltage VT, the voltage comparison module is configured to output a trigger signal VOUT, concurrently with the counting circuit outputting a predetermined stop signal STOP.

The reference voltage VT is provided by an adjustable constant voltage supply 230.

As discussed above, the voltage VC of the first capacitor 120 is taken as a basis for subsequently obtaining a count using one of several methods. For example, an analog-to-digital conversion module may be used to convert the voltage VC of the first capacitor 120 into a digital signal, from which the count may be determined using an empirical formula derived from many experiments. Compared with such approaches, directly obtaining the trigger signal VOUT using the voltage comparison module 200 in accordance with this embodiment allows higher operability and improved accuracy while not compromising the counting performance. It is to be understood that, after being output from the counting circuit, the predetermined trigger signal VOUT may be either directly taken as the stop signal STOP, or further processed by another module to derive the stop signal STOP. It is to be understood that, in this embodiment, the trigger signal VOUT is a low-level pulse. However, in alternative embodiments, it may assume another form such as a high-level pulse, a rising edge, a falling edge, etc. The stop signal STOP should be construed in the same way.

Based on the above description, the quantity of charge carried in each pulse in the counting current I3 may be given by: Q1=MI3×Dutycycle×T=Delta_I3×T, where MI3 represents amplitude of the counting current I3; Dutycycle, a duty cycle of the pulse; Delta_I3, an equivalent current; and T, a time duration of the pulse.

Accordingly, the reference voltage VT may be mapped to a countdown value SUM according to:

SUM=C×VT/Q1, where C is the capacitance of the first capacitor 120.

In practical applications, SUM may be determined by design, and VT may be derived based on the characteristics of the pulse signal concerned. Alternatively, VT may be roughly determined, and other parameters of the circuit, such as the capacitance C of the first capacitor 120 and the amplification coefficient Beta of the second transistor, may be then finely tuned based on SUM until the design meets the desired design specification.

It is to be understood that the adjustable constant voltage supply 230 is not part of the counting circuit and is used herein for the only purpose of providing the reference voltage VT. It may be of any conventional structure and may employ any conventional method, without limiting the scope of present invention in any sense.

Additionally, referring to FIG. 2, a biasing circuit for a key voltage comparison circuit in the voltage comparison module 200 may be provided by a constant current source S1. The use of this constant current source S1 enables the voltage comparison module 200 to have improved accuracy and enhanced resistance to interfering signals.

Referring to FIG. 2, the first input terminal 210 includes a p-channel junction field effect transistor (JFET) PJ1, the p-channel JFET has a gate connected to the first capacitor 120. As can be seen from the above description, any leakage of charge from the first capacitor 120 may degrade the accuracy of the counting circuit. In order to overcome this, it is necessary for input impedance of the first input terminal 210 to be infinite. The p-channel JFET is chosen for this reason while taking into account that it facilitates the fabrication of the circuit with lower cost. Conventional integrated circuit (IC) fabrication processes do not involve the formation of p-channel JFET devices. However, the IC fabrication process in which the inventors are engaged has been developed to allow the formation of p-channel JFET devices. More preferably, the second input terminal also includes a p-channel JFET PJ2 to reduce the requirements on the reliability of the adjustable constant voltage supply 230 and additionally increase the counting circuit's accuracy.

Preferably, the counting circuit further includes a signal processing module 300, the signal processing module 300 is configured for converting the trigger signal VOUT into the stop signal STOP, marking the end of a counting cycle. The signal processing module 300 is able to decouple the trigger signal VOUT from the stop signal STOP that is required by the other subsequent circuit, making it unnecessary to take into account output waveform considerations in the design of the voltage comparison module 200. This simplifies the design as only performance of the circuit such as accuracy and reliability needs to be considered.

In one embodiment, the trigger signal VOUT is a low-level pulse, while the stop signal STOP is required to be a high-level pulse. To this end, in this embodiment, the signal processing module 300 includes a second capacitor 310 and a terminal 320 for outputting the stop signal. A first terminal of the second capacitor 310 is connected to the voltage comparison module 200, and a second terminal of the second capacitor 310 is connected to the terminal 320. When the trigger signal VOUT is high, with the first terminal being positive, the second capacitor 310 is charged or held, and the signal processing module 300 outputs a low level. When the trigger signal VOUT is low, with the second terminal being positive, the second capacitor 310 is charged, and the signal processing module 300 outputs a high level during the charging process. The signal processing module 300 may further include other components wired as shown in FIG. 2. This embodiment operates as follows:

(1) When VOUT is kept high, with the first terminal being positive, the second capacitor 310 is charged and held. Since VOUT is high for the most part, the second capacitor 310 is almost always in a fully charged state. As a result, the power supply voltage, i.e., vdd, is present at the first terminal of the second capacitor 310, and a voltage of 0.7 V (i.e., Ube, this value may vary with the size of the transistor) is present at the second terminal of the second capacitor 310. Therefore, there is a voltage difference that is equal to vdd minus 0.7 V between the terminals of the second capacitor 310.

(2) When VOUT drops low, a transistor Q16 is turned on, abruptly bringing the voltage at the first terminal of the second capacitor 310 to 0.7 V. However, due to the voltage difference between the terminals of the second capacitor 310 does not change therewith, the voltage at the second terminal of the second capacitor 310 shifts to 0.7 V−(vdd−0.7 V)=1.4 V−vdd, the voltage at the second terminal of the second capacitor 310 is negative because vdd is higher than 1.4 V. As a result, a transistor Q17 is turned off, and the stop signal STOP output from the signal processing module 300 is pulled high.

(3) Subsequently, as shown in FIG. 2, the second capacitor 310 is charged with a current I4, and Q17 remains off before the voltage at the second terminal of the second capacitor 310 reaches 0.7 V. As a result, the stop signal STOP remains high.

(4) Upon the voltage at the second terminal of the second capacitor 310 reaching 0.7 V, Q17 is turned on, pulling the stop signal STOP low.

In summary, the stop signal STOP is high in the period Tc in which the voltage at the second terminal of the second capacitor 310 is charged with the current I4 from 1.4 V-vdd to 0.7 V, i.e., experience a change of 0.7 V−(1.4 V−vdd)=vdd−0.7 V. The charge period Tc (i.e., the period in which the stop signal STOP is high) can be according to Tc=C2*(vdd-0.7 V)/I4, where C2 denotes the capacitance of the second capacitor 310.

Referring to FIG. 2, in the signal processing module 300, a biasing current for I4 for charging the second capacitor 310 may be provided by a constant current source 51. This ensures stability of I4 and pulse width accuracy of the stop signal STOP.

It is to be understood that the foregoing embodiment presents merely one possible implementation of the signal processing module 300. Any and all circuit variants capable of taking advantage of the charge and discharge properties of the second capacitor 310, utilizing transitions of the trigger signal VOUT to reverse the signs of the terminals during charging of the second capacitor 310 and working with another circuit to accomplish at least one of signal conversion, stabilization, rectification and amplification of the output current from the second capacitor 310 are considered to be within the scope of the appended claims.

It is to be understood that this embodiment aims to address the situation where the trigger signal VOUT is a low-level pulse while the stop signal STOP is required to be a high-level pulse, and for different requirements placed on the trigger signal VOUT and the stop signal STOP, the signal processing module 300 should be modified accordingly. Any and all variants of the signal processing module 300 based on the design concept as disclosed above as well as common general knowledge in the art are intended to fall within the scope of the appended claims.

Referring to FIG. 1, in one embodiment, the counting circuit further includes a discharge module 400, the discharge module 400 is connected to the first capacitor 120, and a trigger terminal 410 of the discharge module 400 is connected to the terminal 320 of the signal processing module 300. In response of the signal processing module 300 outputting the stop signal STOP, the discharge module 400 is configured to discharge the first capacitor. This arrangement enables the counting circuit to be automatically reset so that immediately after outputting the stop signal STOP, the counting circuit can start another counting cycle. It is to be understood that the trigger terminal 410 of the discharge module 400 may be connected to an output terminal of the signal processing module 300 either directly or via one or more other components. For example, the output terminal of the signal processing module 300 may be connected to a microprocessor, which has an output terminal that is in turn connected to the trigger terminal 410 of the discharge module 400. The microprocessor may have an internal logic configured to, upon receiving the stop signal STOP, output, from the aforesaid output terminal, another signal that triggers a discharge process.

Referring to FIG. 1, the counting circuit may further include a reset module 500, the reset module 500 is connected to the first capacitor 120. The reset module 500 may have a reset trigger terminal 510, and the reset module 500 may be configured to discharge the first capacitor 120 when a reset signal RESET is received at the reset trigger terminal 510.

It is to be understood that the discharge module 400 and the reset module 500 may be configured either as described above and shown in FIG. 2, or otherwise based on the same design principles as have been described hereinabove.

In a representative embodiment, major components of a particular implementation of the counting circuit and wiring thereof are as shown in FIG. 2, and a waveform of this embodiment in response to a continuous pulse signal is shown in FIG. 3.

In FIG. 3, the pulse signal is indicated at PULSE, the counting current at I3, the reset signal at RESET, the reference voltage at VT, the voltage of the first capacitor 120 at VC, the trigger signal at VOUT, and the stop signal at STOP, and the abscissa represents time. In the period from 0 to 200 µs, RESET is kept high. Therefore, despite the presence of the counting current I3, the voltage VC of the first capacitor 120 does not experience any change. RESET is pulled low at the time point 200 µs, leading to a stepwise ramp of the voltage VC of the first capacitor 120 under the action of the incoming counting current I3 until VC exceeds the reference voltage VT. At this point, the trigger signal VOUT is output as a low-level pulse, and the stop signal STOP is simultaneously output as a high-level pulse having a pulse width corresponding to the length of the charge time period Tc of the second capacitor 310 as detailed above. Under the action of the stop signal STOP, the voltage VC of the first capacitor 120 is reset to 0, starting the next counting cycle.

A waveform of this embodiment in response to a series of discrete pulse signals is shown in FIG. 4, in which the series of pulse signals is indicated at PULSE, the counting current at I3, the reset signal at RESET, the reference voltage at VT, the voltage of the first capacitor 120 at VC, the trigger signal at VOUT, and the stop signal at STOP, and the abscissa represents time. In the period from 0 to 200 µs, RESET is kept high. Therefore, despite the presence of the counting current I3, the voltage VC of the first capacitor 120 does not show any change. RESET is pulled low at the time point 200 µs, leading to a stepwise ramp of the voltage VC of the first capacitor 120 under the action of the incoming counting current I3. In this process, if there is an interruption in PULSE, the voltage VC of the first capacitor 120 will stop ramping and be held without changing, until the next pulse signal appears. When this happens, the voltage VC of the first capacitor 120 continues to ramp until VC exceeds the reference voltage VT. At this point, the trigger signal VOUT is output as a low-level pulse, and the stop signal STOP is simultaneously output as a high-level pulse. Under the action of the stop signal STOP, the voltage VC of the first capacitor 120 is reset to 0, starting the next counting cycle.

As additionally demonstrated by FIGS. 3 and 4, irrespective of whether the pulse signal PULSE is continuous or not, the number of pulses SUM recorded in the countdown counter remains the same. Moreover, when the pulse signal PULSE has non-variable amplitude and duty cycle, according to the above formula, the initial value SUM of the countdown counter may be modified simply by adjusting the capacitance C of the first capacitor 120 and the reference voltage VT. Thus, as a major advantage, this counting circuit can be used as a countdown counter that is adaptive to multiple types of input pulse signals (continuous or discrete signals with different amplitudes, duty cycles and frequencies) simply by adjusting external parameters without needing to modify the internal structure of the counting circuit.

In this embodiment, there is also provided a chip including the counting circuit as defined above. The chip is fabricated using a transistor IC fabrication process or a metal-oxide-semiconductor field effect transistor (MOSFET) IC fabrication process, and has the same advantages as the above-described counting circuit. In particular, when it is fabricated using a transistor IC fabrication process, it can be produced at reduced cost, which is conducive to massive production. The chip may also be fabricated using an MOSFET IC fabrication process. Those skilled in the art can understand and appreciate how to configure and form other components of the chip based on common general knowledge in the art, and a detailed description thereof is deemed unnecessary and omitted.

In summary, compared with the prior art, in the counting circuit and chip provided in the present invention, the charge counter module 100 includes the pulse processing module 110 and the first capacitor 120. The pulse processing module 110 is configured to covert a received pulse signal into a counting current I3 and to transfer the converted counting current I3 to the first capacitor 120, and the first capacitor 120 is configured to receive the counting current I3 and store charge carried in the counting current I3. The counting circuit takes the voltage of the first capacitor 120 as a basis for counting. With this arrangement, the input voltage pulse signal is converted to a current signal in the form of micro pulses for charging the first capacitor 120, and a counting result is obtained by detecting the voltage of the first capacitor 120, achieving the following advantages: no need to take care of whether the input pulse signal is continuous or discrete; high resistance to interference; adaptiveness to various input pulse signals of different waveforms and/or with different frequencies; and the ability to solve the problem with the conventional counting circuits that they may not be able to cope with irregular pulse signals and may even not be able to operate normally when such an irregular pulse signal is input.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:

1. A counting circuit comprising a charge counter module, a voltage comparison module and a signal processing module, the charge counter module comprising a pulse processing module and a first capacitor, the pulse processing module comprising a first circuit, a second circuit and a current mirror, the first circuit comprising a first transistor and a resistor, the second circuit comprising a second transistor, the first circuit connected to the second circuit via the current minor, the first transistor configured to convert a received pulse signal into a first current, the current minor configured to minor the first current to a second current, the second transistor configured to convert the second current into a counting current and transfer the counting current to the first capacitor, the second current having an effective value present at a ratio of equal to 100 or greater to an effective value of the counting current, the first capacitor configured to receive the counting current and store charge carried by the counting current, the counting circuit taking a voltage of the first capacitor as a basis for counting, the voltage comparison module comprising a first input unit and a second input unit, the first input unit configured to receive the voltage of the first capacitor, the second input unit configured to receive a preset reference voltage, the voltage comparison module configured to output a trigger signal in the event of the voltage of the first capacitor rising beyond the preset reference voltage, the signal processing module configured to convert the trigger signal into a stop signal to realize a counting cycle.

2. The counting circuit of claim 1, wherein the first transistor is an NPN transistor and has a base for receiving the pulse signal, a collector connected to an input terminal of the current mirror, and an emitter connected to one end of the resistor, the other end of the resistor being grounded, and wherein the second transistor is a PNP transistor and has an emitter connected to an output terminal of the current minor, a collector that is grounded, and a base for outputting the counting current.

3. The counting circuit of claim 1, wherein the first input unit comprises a p-channel junction field effect transistor (JFET) having a gate connected to the first capacitor.

4. The counting circuit of claim 1, wherein the second input unit comprises a p-channel junction field effect transistor (JFET) having a gate connected to an adjustable constant voltage supply.

5. The counting circuit of claim 1, wherein the signal processing module comprises a second capacitor and a stop signal output terminal, the second capacitor having a first terminal connected to the voltage comparison module, the second capacitor having a second terminal connected to the stop signal output terminal, the second capacitor configured to be charged or held, with the first terminal being positive, in the event of the trigger signal being at a high level, resulting in a low level being output from the signal processing module, the second capacitor configured to be charged, with the second terminal being positive, in the event of the trigger signal being at a low level, resulting in a high level being output from the signal processing module during the charging process.

6. The counting circuit of claim 1, further comprising a discharge module connected to the first capacitor, the discharge module having a trigger terminal connected to the stop signal output terminal of the signal processing module, the discharge module configured to discharge the first capacitor in response to the stop signal being output from the signal processing module.

7. The counting circuit of claim 1, further comprising a reset module connected to the first capacitor, the reset module having a reset trigger terminal, the reset module configured to discharge the first capacitor in response to a reset signal being received at the reset trigger terminal.

8. A chip comprising the counting circuit of claim 1.

* * * * *